United States Patent [19]

Lord et al.

[11] 4,047,120
[45] Sept. 6, 1977

[54] TRANSIENT SUPPRESSION CIRCUIT FOR PUSH-PULL SWITCHING AMPLIFIERS

[75] Inventors: Harold Wilbur Lord, Mill Valley, Calif.; Jimmy Dale Rogers, Dallas, Tex.

[73] Assignee: The United States of America as represented by the Secretary of the Navy, Washington, D.C.

[21] Appl. No.: 705,489

[22] Filed: July 15, 1976

[51] Int. Cl.² .............................................. H03F 21/00
[52] U.S. Cl. .................................... 330/207 P; 328/9; 330/118; 330/122; 330/195; 330/207 A
[58] Field of Search ...................... 328/8, 259; 330/15, 330/118, 207 A, 207 P, 123, 199, 122, 195; 331/62; 361/111

[56] References Cited
U.S. PATENT DOCUMENTS 3,206,695 9/1965 Bennett, Jr. ............................. 331/62
3,629,725 12/1971 Chun .................................. 330/15 X
3,976,955 8/1976 Hamada ............................ 330/207 P Primary Examiner—Lawrence J. Dahl
Attorney, Agent, or Firm—R. Sciascia; R. Beers; S. Sheinbein

[57] ABSTRACT

A protective coupling circuit is located between the D.C. supply voltage and the amplifier components of a push-pull switching amplifier to suppress transients created during switching. The coupling circuit comprises a power supply filter with an inductor coil and capacitor, and circuitry for limiting the voltage on the individual switching elements and the output coil. Excess voltages caused by transients are fed to the power supply filter. In an alternative embodiment the power supply filter inductor coil is actually an auxiliary winding on the amplifier output transformer rather than a separate coil. This allows for use of some smaller capacity circuit elements.

16 Claims, 2 Drawing Figures

TRANSIENT SUPPRESSION CIRCUIT FOR PUSH-PULL SWITCHING AMPLIFIERS

BACKGROUND OF THE INVENTION

This invention relates generally to switching amplifiers, and more particularly to limiting transient voltage in push-pull amplifiers during switching intervals.

The use of push-pull switching amplifiers in a square wave or pulse type of operation has proven to be an effective means of achieving high efficiencies in amplifiers as well as in inverters. This is particularly true when the amplifiers operate at switching rates greater than the fundamental frequency. Such higher switching rates are provided by Class S amplifiers by using some form of pulse width modulation (PWM), pulse duration modulation (PDM) or time-ratio cntrolled modulation. A description of high switching rate operation can be found in *Principles of Inverter Circuits* by B. D. Bedford and R. G. Hoft, John Wiley and Sons, Inc., 1964, pages 254–262.

A problem heretofore has been that when push-pull transformers are used in switching amplifiers, if one half of the push-pull primary is not very tightly coupled to the other half of the push-pull primary, high transient voltages can occur during the switching interval. The transient occurs during the interval that the conducting switch is turning "off" and its mate is turning "on" and also, in Class S operation as a switch turns "on" and "off" during its half of the operating cycle. The amplitude and frequency of the transient voltage is a function of a combination of three or more of the following parameters of the transformer and its associated excitation circuit:

1. The leavage inductances of the transformer.
2. The distributed capacitances and other shunt capacitances which may be across some or all of the transformer windings.
3. The abruptness with which the current-carrying switch element interrupts the primary current.
4. The amplitude of the primary current at the instant of interruption.
5. The abruptness with which the "closing" switch element changes from a very high impedpance to a very low impedance.
6. The voltage across the "open" switch elements at the time the "closure" starts.

In many cases it is impossible or impractical to design a tranformer with the degree of coupling in the push-pull primary that is necessary to limit voltage transients to an acceptable level.

Circuits have been proposed which protect push-pull amplifiers from excessive currents. These protective circuits, however, have been designed to handle excessive input signals rather than internally generated transients. Thus, emphasis has been on passing the excess signal from the amplifier input to its output to bypass the individual amplification elements (generally either vacuum tubes or high-power transistors). The circuits have not provided for adequate protection against internal transients since these could effect the individual elements without going through the input terminal. Further, no means has heretofore been provided to store and/or recover any of the transient voltage energy which arises from the amplifier inductors and capacitors while still protecting the amplifier.

SUMMARY OF THE INVENTION

Accordingly, there is provided a protective coupling circuit for limiting transient voltages in switching type push-pull amplifiers while conserving a large percentage of both capacitively and inductively stored energy. One embodiment discloses a push-pull switching amplifier having a transient suppressing network comprising center tapped A.C. inductor means across the input supply, feeding two current paths which include identical capacitor-diode combinations. The induction-capacitor arrangement acts as a filter to the input supply. The two diodes act as a shunt across the transformer primary and limit the voltage at the ends of the transformer primary winding to a maximum positive potential equal to the bias voltage. The excess energy is conducted via the diodes to the center tap on the inductor and thus is pumped back into the supply filter.

A second embodiment would replace the center-tapped inductor with a center-tapped auxiliary winding wound on the core of the output transformer. The auxiliary winding has the same number of turns as the primary and is tightly coupled thereto. The primary winding is magnetically coupled to the switching elements and the capacitors need only support the switching frequencies. The lower frequency components, such as the fundamental frequency component if a Class S high frequency switching operation is used, are magnetically coupled to the output.

OBJECTS OF THE INVENTION

It is therefore an object of the present invention to provide for limiting transient voltage to an acceptable level while maintaining high efficiency in a push-pull amplifier.

Another object of the present invention is to allow for more freedome of circuit design by relieving the transient problem in switching amplifiers.

A further object of the present invention is to provide for a greater use of rapid switching in Class S push-pull amplifiers by suppression of the transients created during switching.

Still another object of the present invention is to protect the amplifier from transients while conserving a large percentage of the capacitively and inductively stored energy.

BRIEF DESCRIPTION OF THE DRAWINGS

These and other objects, features and attendant advantages of the present invention will become better understood by reference to the following detailed description when considered in connection with the accompanying drawings wherein.

DETAILED DESCRIPTION OF THE PREFERRED EMBODIMENTS

Figure 1:
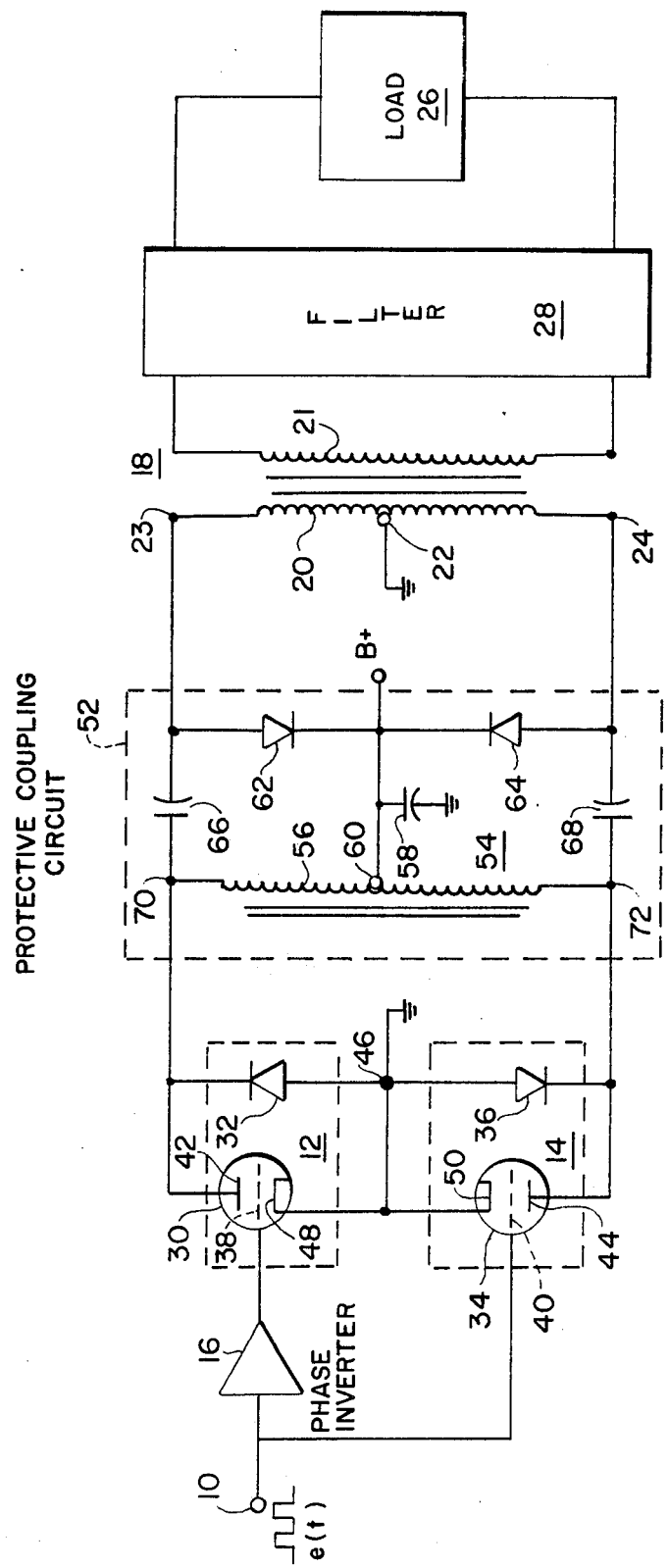
FIG. 1 shows a partial block and partial schematic diagram of a first embodiment of a protective coupling circuit according to the invention.

Referring now to the drawings wherein like reference numerals designate identical or corresponding parts throughout the several views, and more particularly to FIG. 1, there is shown a push-pull switching amplifier having an input terminal 10 to which an input signal $e(t)$ is applied. Input signal $e(t)$ is applied directly to switching amplifier element 14, and to identical switching amplifier element 12 by phase inventer 16 coupled therebetween. Phase inverter 16 is provided on the input of switching element 12 to cause it to be excited by an input 180° out of phase with the second switching element 14, although any other conventional technique such as a centertapped tranformer may be employed to provide the phase inversion. The outputs of elements 12 and 14 are coupled to primary coil 20 of output transformer 18, element 12 coupled to end terminal 23 thereof and element 14 coupled to end terminal 24 on the other end thereof. In conventional push-pull amplifiers, the D.C. supply voltage, B+ is coupled directly to center tap 22 of primary coil 20, but, as will be discussed hereinafter, the present invention modifies this B+ input. Secondary coil 21 of the transformer couples the output signals to load 26, after passing through a conventional filter 28 chosen to be appropriate for the particular load.

Solely for purposes of illustration, the switching amplifier elements 12 and 14 are shown to comprise tube and semiconductor diode combinations of 30,,32 and 34, 36, respectively. Any tube or semiconductor device or combination thereof commonly used in the art for push-pull switching amplifiers could be utilized. The input signal $e(t)$ is fed to the input electrode 38 of tube 30 of element 12 at a voltage equal to but 180° out of phase with that fed to input electrode 40 of tube 34 of element 14. After amplification in accordance with the particular characteristics of vacuum tubes 30 and 34, the signals are outputted on output electrodes 42 and 44 respectively. Vacuum tubes 30 and 34 share a common terminal 46 connecting their grounded electrodes 48 and 50 to ground. Diodes 32 and 36 are coupled with their respective cathodes to output anode electrodes 42 and 44 respectively, and their anodes to the common ground terminal 46. This serves to limit the maximum negative voltage swing allowed across vacuum tubes 30 and 34.

In normal push-pull operation the switching elements 12 and 14 alternately conduct for 180° intervals at a desired fundamental frequency. If a Class S operation is desired, each element will alternately conduct several times during its respective half cycle of the fundamental period, thus giving a higher frequency superimposed upon the fundamental frequency. Customarily, some form of pulse width modulation (PWM), pulse duration modulation (PDM), or time-ratio controlled modulation is used in Class S amplifiers to achieve high efficiency. In systems that have a switching rate equal to the fundamental frequency, the primary switching function is obtained by tubes 30 and 34 alternately conducting for approximately 180° intervals. In Class S amplifiers, which commonly have filters with inductive input characteristics, the primary switching function is obtained by tube 30 and diode 36 alternately conducting several times during a half cycle of the fundamental period and then tube 34 and diode 32 alternately conducting. In either case large transient voltages can be generated in primary winding 20 during the switching intervals. The transient is generated because the primary winding leakage inductance $L_e$ is not zero and any attempt to stop current flow abruptly in one side of the primary winding produces a voltage proportional to $L_e$; that is, $V = L_e (di/dt)$. Any inductance that is in series with the primary winding will also contribute to the transient. Efforts to decrease leakage inductance in a transformer are constrained because stray primary capacitance for a particular transformer normally increases when leakage inductance is decreased. That is, the factors that decrease leakage inductance tend to increase stray capacitance. Any stray capacitance must be charged or discharged each time the switch is activated. To maximize efficiency, one must limit stray capacitance. The transients are particularly troublesome in Class S amplifiers since they are generated during Class S switching of the same tube during its half of the operating cycle as well as during the intervals of switching from one tube to the other.

In the first preferred embodiment of the invention as shown by FIG. 1 there is provided a protective coupling circuit 52 which connects the D.C. supply voltage B+ to the amplifier elements. This circuit provides a power supply filter 54 composed of a center-tapped air-gapped inductor coil 56 and a filter capacitor 58 connected from the center-tap 60 to ground. The two halves of inductor 56 are tightly coupled so that large transients do not develop when current suddenly stops in one half and begins to flow in the other half. The B+ voltage is coupled to amplifier elements 12 and 14 via center-tap 60 of inductor coil 56. Current feedback diodes 62 and 64 have their respective anodes connected to end terminals 23 and 24 of output transformer primary coil 20 and their cathodes connected to the B+ carrying center-tap 60. Capacitors 66 and 68 are connected between the respective anodes of the feedback diodes 62 and 64 and end terminals 70 and 72 of inductor coil 56. Current feedback diodes 62 and 64 serve to limit the maximum voltage on each of end terminals 23 and 24 of primary coil 20 to approximately B+ (one end being at positive B+ while the other end is at negative B+). Any transient surges which occur during switching between elements 12 and 14 will be fed back via diodes 62 and 64 to filter capacitor 58. This allows conserving a large proportion of the capacitive and inductive energy built up in the amplifier. Capacitors 66 and 68 block D.C. current flow and are chosen so that their joint action with diodes 62 and 64 and inductor coil 56 will maintain a maximum voltage of approximately twice the B+ level on the vacuum tubes 30 and 34. Capacitors 66 and 68 must be of a large enough capacity to pass the low fundamental frequency of switching even if high frequency Class S operation is being employed since both the high and low frequencies will necessarily have to pass through them.

Figure 2:
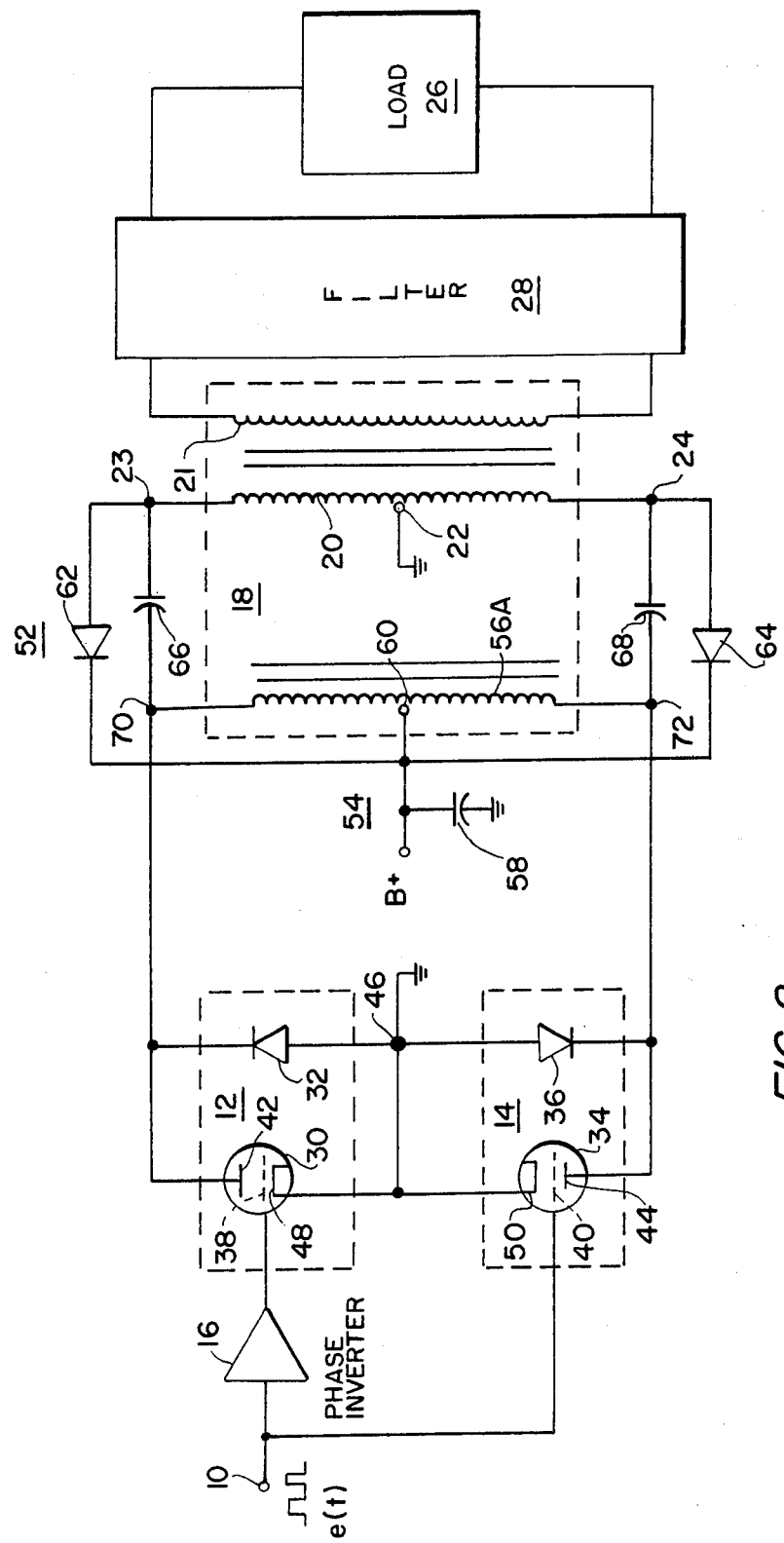
FIG. 2 shows a partial block and partial schematic diagram of a second embodiment of a protective coupling circuit according to the invention.

FIG. 2 illustrates a second embodiment of the invention which can allow for reduction in the capacity of capacitors 66 and 68. In this embodiment in inductor coil 56 of the power supply filter 54 is formed as an auxiliary winding 56A of the primary coil 20 by winding it on the output transformer core. Auxiliary winding 56A comprises the same number of turns as primary winding 20 and each half of the auxiliary 56A is tightly coupled to the primary 20. This arrangement allows the low frequency components to be magnetically coupled to the output transformer secondary coil 21 via the auxiliary winding 56A. Therefore, the capacitors 66 and 68 do not have to carry the low frequencies and can be designed to be only large enough to handle the higher Class S operation switching frequencies. This decrease in the size of the capacitors does not require any corresponding increase in inductance requirements. It should be noted that if the invention is described in terms of a single frequency amplifier, the only low frequency component is the fundamental frequency. However, if the amplifier is excited by a frequency modulated (FM)

signal, a frequency-shift-keyed (FSK) signal or any other signal containing information, then there will be more than one low frequency. Such a signal is typically referred to as a carrier frequency plus sideband components, and will be included in the low frequency components.

The configuration shown in FIG. 2 also allows for use of a smaller conductor in winding the primary coil 20. This results from the fact that primary coil 20 with its grounded center tap only has to handle the high-frequencies. The B+ reference auxiliary winding 56A carries the low fundamental frequency (which it couples to the secondary coil 21) along with the high current from B+. This can be more readily seen if the circuit is examined by considering the role of the center-tapped primary winding 20 and the role of the center-tapped auxiliary winding 56A as interchanged. That is, view the winding which has its center tap 60 connected to B+ as the primary winding and consider the winding with its center tap 22 connected to a ground as the auxiliary, transient-suppressing winding. By viewing the windings in this manner, it is easy to see that the winding which has its center tap grounded does not need to carry as much current as the B+ reference winding. It need only handle the high frequency components. Therefore, the grounded winding can be wound with a smaller conductor.

To better understand the operation of the invention as a Class S amplifier, consider the circuit of FIG. 2 with coil 20, diodes 62 and 64, and capacitors 66 and 68 deleted. Assume that the driving signal $e(t)$ switches at a rate much higher than the resonant frequency of filter 28 and load 26, and that filter 28 appears inductive at the switching rate of $e(t)$. At a point in time when the grid of tube 30 is driven positive and conventional current is flowing out of the high voltage power supply (B+) from terminal 70 and through tube 30 to ground 46, the voltage at terminal 70 will be equal to the tube voltage drop, i.e., a relatively low voltage. Because of transformer action in 56A, the voltage at terminal 72 will be B+ plus the voltage drop from 60 to 70, i.e., almost 2B+. At the next switching interval, the grid of tube 30 is driven negative by $e(t)$. However, assuming that one is in the interval of the cycle when current is near a maximum and the inductive load forces current to continue to flow in the same direction in secondary winding 21, as a result of the inductive load and transformer action, current now flows from ground 46 through diode 36 and from terminal 72 to the high voltage power supply capacitor 58. The voltage drop across diode 36 is small and, therefore, the voltage drop from terminal 72 to 60 is almost B+. As a result of transformer action, the voltage at terminal 70 is 2B+ minus the small drop across diode 36.

The above operation describes the manner in which a Class S amplifier with an ideal transformer would operate. For a practical transformer, the leakage inductance and stray capacitance are not zero and the leakage inductance will modify the previous discussion in the following way. Leakage inductance ($L_e$) between one-half-primary the other half-primary will tend to keep current flowing from terminal 60 and 70 even though tube 30 is turned off and current has begun to flow in diode 36. As a result of the leakage inductance, the voltage at terminal 70 will tend to rise much higher than 2B+ in accordance with $V + L_e(di/dt)$.

This invention suppresses these very large voltage that are the result of leakage inductance. The suppression is accomplished in the following manner. A second primary winding 20 with a grounded center tap is added to the output transformer. Diodes 62 and 64 are added which prevent the voltage at terminals 23 and 24 from rising substantially above the B+ voltage. Therefore, under ideal conditions, the voltage at terminal 23 and 24 swings from $-B+$ to $+B+$ in accordance with normal ideal transformer action. The diodes 62 and 64 limit the voltage transients associated with a practical transformer to B+ plus the diode forward conducting voltage drop ($V_D$). Capacity coupling of terminals 70 and 23 assures that since terminal 23 cannot rise postive much above the B+, neither can terminal 70 rise substantially above 2B+. That is, the voltage at terminal 70 is clamped by the action of diode 62 through the capacitor 66. Thus, the invention limits the transient voltage on the switching element to approximately 2B+.

There has therefore been provided a convenient means of limiting transients created by switching of the amplifier elements while conserving a large percentage of both the capacitively and inductively stored energy of the amplifier. The particular tube types and semiconductor elements that would be used are almost totally dependent upon the power level and operating frequency for that particular amplifier. As one example, a 1 kW amplifier can be built utilizing Eimac 3-1000Z triode vacuum tubes and Unitrode UDC 7.5 diodes. Obviously, numerous modifications and variations of the present invention are possible in light of the above teachings. It is therefore to be understood that within the scope of the appended claims the invention may be practiced otherwise than as specifically described therein.

What is claimed and desired to be secured by Letters Patent of the United States is:

1. A push-pull amplifier comprising:
    first and second switching amplifier elements operating to alternately conduct an input signal for 180° intervals,
    means for phase shifting the input signals to said first switching amplifier element 180° relative to the input signal of said second switching amplifier element,
    an output transformer having a primary coil with first and second end terminals located at respective ends of the coil and a grounded center tap, said first end terminal being coupled to the output of said first switching amplifier element, said second end terminal being coupled to the output of said second switching amplifier element, and a secondary coil connected to a load,
    A D.C. power source; and
    protective coupling means connecting said D.C. power source to said first and second end terminals of said primary coil and the outputs of the first and second switching amplifier elements, said protective coupling means limiting the voltage level of said primary coil switching amplifier elements to inhibit high transient voltages caused during conductive switching of said amplifier elements.

2. A push-pull amplifier as set forth in claim 1 wherein said protective coupling means comprises:
    a power supply filter comprising a filter capacitor and an inductor coil with first and second end terminals, the center tap of said inductor coil connected to said D.C. power source, said first end terminals of the inductor coil coupled to said first end terminals of said output transformer primary coil and the output of said first switching amplifier element, said second end terminal of the inductor coil coupled to said second end terminal of said output transformer primary coil and the output of said second switching amplifier element, and said filter capacitor coupled between the inductor coil center tap and ground.

3. A push-pull amplifier as set forth in claim 2 wherein said protective coupling means further includes a first feedback diode having its cathode coupled to the inductor coil center tap and its anode coupled between the first end terminal of said output transformer primary coil and said first end terminal of said inductor coil, and a second feedback diode having its cathod coupled to said inductor coil center tap and its anode coupled between said second end terminal of said output transformer primary coil and said second end terminal of said inductor coil, whereby transient currents caused during switching of said switching amplifier elements will feedback from said output transformer primary coil to said power supply filter.

4. A push-pull amplifier as set forth in claim 3 wherein said first and second feedback diodes limit the voltage across each half of the primary coil of said output transformer to substantially the voltage of said D.C. power source.

5. A push-pull amplifier as set forth in claim 3 wherein said protective coupling means further includes a first capacitor coupled between the anode of said first feedback diode and said first end terminal of said inductor coil, and a second capacitor coupled between the cathode of said second feedback diode and said second end terminal of said inductor coil, whereby the maximum voltage across said first and second switching amplifier elements is limited.

6. A push-pull amplifier as set forth in claim 5 wherein said first and second capacitors, said first and second feedback diodes, and said inductor coil limit the voltage across said first and second switching amplifier elements to approximately twice the voltage of said D.C. power source.

7. A push-pull amplifier as set forth in claim 3 wherein said first and second switching amplifier elements each include a diode coupled by its cathode to the switching amplifier element output and by its anode to ground.

8. A push-pull amplifier as set forth in claim 2 wherein the inductor coil is an auxiliary winding wound adjacent to the primary coil on the core of said output transformer.

9. A push-pull amplifier as set forth in claim 8 wherein said protective coupling means further includes a first feedback diode having its cathode connected to the inductor coil center tap and its anode connected between said first end terminal of said output transformer primary coil and said first end terminal of said inductor coil, and a second feedback diode having its cathode connected to said inductor coil center tap and its anode connected between said second end terminal of said output transformer primary coil and said second end terminal of the inductor coil, whereby transient currents caused during switching of said first and second switching amplifier elements will be fed back from said output transformer primary coil to said power supply filter.

10. A push-pull amplifier as set forth in claim 9 wherein said first and second feedback diodes limit the voltage across said output transformer one-half primary coil to the voltage of said D.C. power source.

11. A push-pull amplifier as set forth in claim 9 wherein said protective coupling means further includes a first capacitor connected between the anode of said first feedback diode and said first end terminal of said inductor coil, and a second capacitor connected between the anode of said second feedback diode and said second end terminal of said inductor coil, whereby the maximum voltage across the switching amplifier element is limited.

12. A push-pull amplifier as set forth in claim 11 wherein the first and second capacitors limit the voltage across said first and second switching amplifier elements to approximately twice the voltage of said D.C. power source.

13. A push-pull amplifier as set forth in claim 8 wherein said output transformer primary coil is wound with a smaller conductor than said inductor coil conductor.

14. A push-pull amplifier as set forth in claim 8 wherein said inductor coil has the same number of winding turns as the primary coil.

15. A push-pull amplifier comprising:
first and second switching amplifier elements operating to alternately conduct an input signal for 180° intervals;
means for phase shifting the input signals to said first switching amplifier element 180° relative to the input signal of said second switching amplifier element;
an output transformer having a primary coil with first and second end terminals located at respective ends of the coil and a grounded center tap, said first end terminal being coupled to the output of said first switching amplifier element, said second end terminal being coupled to the output of said second switching amplifier element, and a secondary coil connected to a load;
a D.C. power source; and
protective coupling means connecting said D.C. power source to said first and second end terminals of said primary coil and the outputs of the first and second switching amplifier elements, said protective coupling means comprising a first feedback diode having its cathode coupled to said D.C. power source and its anode coupled to the first end terminal of said output transformer primary coil and to the output of said first switching amplifier element, and a second feedback diode having its cathode coupled to said D.C. power source and its anode coupled to the second end terminal of said output transformer primary coil and to the output of said second switching amplifier element whereby transient currents caused during switching of said switching amplifier elements will feedback from said output transformer primary coil to said D.C. power source thereby inhibiting high transient voltages caused during conductive switching of said amplifier elements.

16. A push-pull amplifier comprising:
first and second switching amplifier elements operating to alternately conduct an input signal for 180° intervals;
means for phase shifting the input signals to said first switching amplifier element 180° relative to the input signal of said second switching amplifier element;
an output transformer having a primary coil with first and second end terminals located at respective ends of the coil and a grounded center tap, said first end terminal being coupled to the output of said first switching amplifier element, said second end terminal being coupled to the output of said second switching amplifier element, and a secondary coil connected to a load;

a D.C. power source, and protective coupling means connecting said D.C. power source to said first and second end terminals of said primary coil and the outputs of the first and second switching amplifier elements, said protective coupling means comprising:

an inductor coil wound on the core of said output transformer adjacent to the primary coil having a center tap connected to said D.C. power source;

a first feedback diode having its cathode coupled to the inductor coil center tap and D.C. power source and its anode coupled to the first end terminal of said output transformer primary coil and said first end terminal of said inductor coil; and a second feedback diode having its cathode coupled to the inductor coil center tap and D.C. power source and its anode coupled to the second end terminal of said output transformer primary coil and said second end terminal of said inductor coil, whereby transient currents caused during switching of said switching amplifier elements will feedback from said output transformer primary coil to said D.C. power source thereby inhibiting high transient voltages caused during conductive switching of said amplifier elements.

* * * * *